United States Patent
Park

(10) Patent No.: US 10,998,081 B1
(45) Date of Patent: May 4, 2021

(54) MEMORY STORAGE DEVICE HAVING AUTOMATIC ERROR REPAIR MECHANISM AND METHOD THEREOF

(71) Applicant: Winbond Electronics Corp., Taichung (TW)

(72) Inventor: San-Ha Park, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/790,750

(22) Filed: Feb. 14, 2020

(51) Int. Cl.
| | |
|---|---|
| *G11C 16/06* | (2006.01) |
| *G11C 29/00* | (2006.01) |
| *G11C 29/42* | (2006.01) |
| *G11C 29/44* | (2006.01) |
| *G11C 29/02* | (2006.01) |
| *G11C 11/406* | (2006.01) |
| *G11C 29/24* | (2006.01) |
| *G11C 29/12* | (2006.01) |

(52) U.S. Cl.
CPC ........ *G11C 29/76* (2013.01); *G11C 11/40615* (2013.01); *G11C 29/027* (2013.01); *G11C 29/24* (2013.01); *G11C 29/42* (2013.01); *G11C 29/44* (2013.01); *G11C 2029/1202* (2013.01); *G11C 2029/1204* (2013.01)

(58) Field of Classification Search
CPC ........ G11C 16/10; G11C 29/52; G11C 29/785
See application file for complete search history.

(56) References Cited

U.S. PATENT DOCUMENTS

| 5,134,616 | A | * | 7/1992 | Barth, Jr. | ............... | G11C 29/84 |
| | | | | | | 714/711 |
| 5,313,424 | A | * | 5/1994 | Adams | .................... | G11C 29/44 |
| | | | | | | 365/200 |
| 5,555,212 | A | * | 9/1996 | Toshiaki | ................ | G11C 29/84 |
| | | | | | | 365/149 |
| 5,859,804 | A | * | 1/1999 | Hedberg | ................ | G11C 29/44 |
| | | | | | | 365/200 |
| 7,386,771 | B2 | | 6/2008 | Shuma | | |
| 9,037,928 | B2 | | 5/2015 | Kleveland et al. | | |
| 9,626,244 | B2 | | 4/2017 | Sohn et al. | | |
| 10,108,509 | B2 | * | 10/2018 | Qidwai | ............... | G11C 11/2277 |
| 2008/0181035 | A1 | * | 7/2008 | Kawasumi | ............. | G11C 29/44 |
| | | | | | | 365/200 |
| 2013/0173970 | A1 | | 7/2013 | Kleveland et al. | | |
| 2014/0082453 | A1 | | 3/2014 | Sikdar et al. | | |
| 2018/0314595 | A1 | | 11/2018 | Eichmeyer et al. | | |

\* cited by examiner

*Primary Examiner* — Tuan T Nguyen
(74) *Attorney, Agent, or Firm* — JCIPRNET

(57) ABSTRACT

The disclosure is directed to a memory storage device and an automatic error repair method thereof. In an aspect, the memory storage device includes a connection interface configured to receive a write command and a word line address associated with the write command, a memory array including a memory bank which contains an error correction code (ECC) detector, a plurality of memory cells controlled by a word line address, and a plurality of redundant memory cells controlled by a redundant word line address, a fuse blowing controller configured to receive the word line address to blow an electrical fuse of the word line address to enable the plurality of redundant memory cells, and a memory control circuit configured to transfer data from the plurality of memory cells through a bit line into the plurality of redundant memory cells in response to the electrical fuse having been blown.

20 Claims, 8 Drawing Sheets

MEMORY STORAGE DEVICE HAVING AUTOMATIC ERROR REPAIR MECHANISM AND METHOD THEREOF

TECHNICAL FIELD

The disclosure is directed to a memory storage device having an automatic error repair mechanism and an automatic error repair method used by a memory storage device.

BACKGROUND

Presently, since user data stored in a memory storage device are expected to be highly reliable, a typical memory storage device would apply a particular error correction code (ECC) technique in order to detect bit failures and to subsequently restore the data associated with the bit failures. If cells in the memory storage device are damaged or have become weaker, memory bits stored in the damaged cells could be detected by the ECC. However, the cells that are physically damaged or worn out might not be repaired by the ECC, and thus memory bits stored on these damaged cells would likely continue to fail. Moreover, the ECC would only able to fix a predetermined number of bits. If one or more additional bits other than the predetermined number of bits within the same column or row address have failed, then the data cannot be repaired by the ECC.

Since any ECC technique has a limitation for fixing stored memory bits, a memory storage device may experience unrepairable errors under circumstances such as a cell to cell short, a word line direction failure (e.g. floating word line, word line short to bit line, etc.), and so forth. After a memory storage device has been sold to a customer and is under normal operation, bit failures to have be automatically fixed within a specified period which is predetermined by its product specification, and the bit failures may not exceed the maximum capability of the ECC scheme being used. Such problems could be fatal to a memory storage device that requires high reliability. Therefore, once a memory storage device is under normal operation after it is sold to a user, if failure bits could be automatically detected and physically repaired, then the probability of failures could be greatly reduced.

One way to repair the failure bits is to use a redundant memory block for storing data and address after a failure attempt. However, such scheme would often involve reading and/or writing data through a data line. Such scheme would have difficulties when integrated into existing architecture since the data line is not only used by the redundant memory block but also used by normal operation whenever a write command is received.

SUMMARY OF THE DISCLOSURE

Accordingly, the disclosure is directed to a memory storage device having an automatic error repair mechanism and an automatic error repair method used by a memory storage device.

In an aspect, the disclosure is directed to a memory storage device which would include not limited to: a memory storage device including a connection interface configured to receive a 1s write command and a word line address associated with the write command; a memory array including a memory bank which includes an ECC detector, a plurality of memory cells controlled by a word line address, and a plurality of redundant memory cells controlled by a redundant word line address; a fuse blowing controller configured to receive the word line address to blow an electrical fuse of the word line address to enable the plurality of redundant memory cells and a memory control circuit coupled to the connection interface, the memory array and the fuse blowing controller and configured to: perform a write operation to the plurality of memory cells in response to receiving the write command; receive a failure indication from the ECC detector in response to detecting an error from the write operation; blow the electrical fuse of the word line address to enable the plurality of redundant memory cells in response to receiving the failure indication; and transfer data from the plurality of memory cells through a bit line into the plurality of redundant memory cells in response to the electrical fuse having been blown.

In an aspect, the disclosure is directed to an automatic error repair method used by the memory storage device. The method would include not limited to: receiving a write command and a word line address associated with the write command; performing a write operation to the plurality of memory cells controlled by a word line address of a memory array in response to receiving the write command, wherein the memory array including a memory bank which comprises an ECC detector, the plurality of memory cells, and a plurality of redundant memory cells controlled by a redundant word line address; receiving a failure indication from the ECC detector in response to detecting an error from the write operation; blowing the electrical fuse of the word line address to enable the plurality of redundant memory cells in response to receiving the failure indication; and transferring data from the plurality of memory cells through a bit line into the plurality of redundant memory cells in response to the electrical fuse having been blown.

In order to make the aforementioned features and advantages of the present disclosure comprehensible, exemplary embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the present disclosure and is therefore not meant to be limiting or restrictive in any manner. Also, the present disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
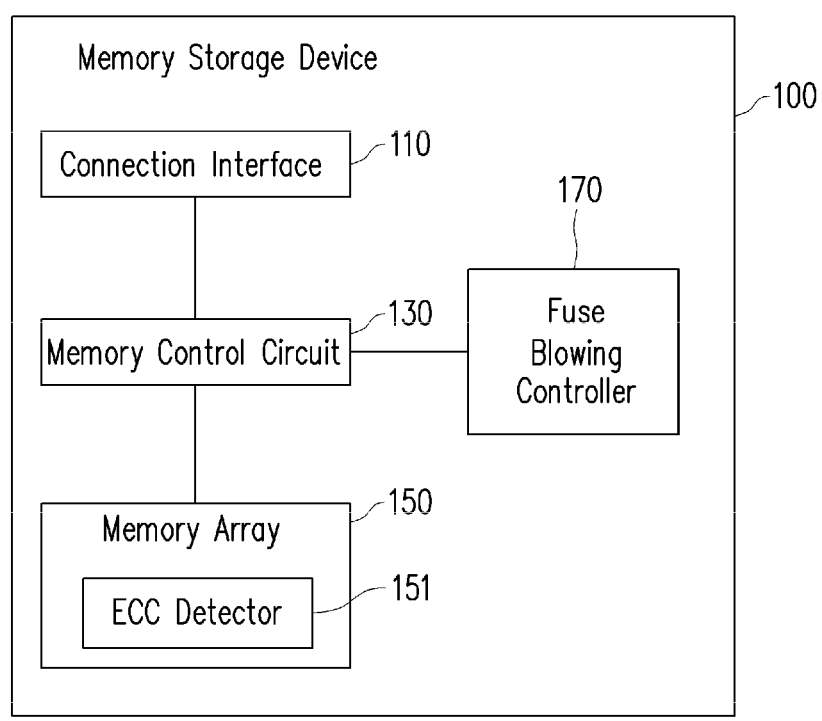
FIG. 1 is a hardware diagram which illustrates a block diagram of the memory storage device having an automatic error repair mechanism in accordance with one of the exemplary embodiments of the disclosure.

Reference will now be made in detail to the present exemplary embodiments of the disclosure, examples of which are illustrated in the accompanying drawings. Wherever possible, the same reference numbers are used in the drawings and the description to refer to the same or like parts.

In order to resolve the aforementioned challenges, the disclosure provides a memory storage device having an automatic error repair mechanism and an automatic error repair method which would automatically repair physical errors in a seamless manner without the awareness of the user in order to increase the reliability of the memory storage device. The memory storage device would utilize an ECC scheme to perform failure detection and error correction. However, the ECC scheme cannot be used to repair hardware defect and thus a failure bit would still exist as long as the failure is due to a physical failure. After a physical error has been detected in one or more cells associated with a failure address of a memory storage device, the error could be repaired automatically by using an electrical fuse technique without any user input and awareness of the user. Further, the data from cells of the failure address would be automatically copied to redundant cells through a bit line without going through a data line. In this way, the copying operation would not interfere with a normal operation of the memory storage device. It is worth noting that a bit line refers to an electrical path connected to a cell of the memory storage device whereas a data line refers to an electrical path which may aggregate multiple bit lines and constitute a data connection between multiple pages.

FIG. 1 shows an exemplary memory storage device 100 which could be any rewritable non-volatile memory such as a dynamic random-access memory (DRAM), non-volatile random-access memory NVRAM), flash memory, and etc. The memory storage device 100 includes not limited to a memory control circuit 130 electrically connected to a connection interface 110, a memory array 150 having an ECC detector, and a fuse blowing controller 170.

In one embodiment, the connection interface 110 is configured to be coupled to a component of a host system (not shown) through a Serial Advanced Technology Attachment (SATA) standard. In an alternative embodiment, the connection interface 110 may comply with the Parallel Advanced Technology Attachment (PATA) standard, the Institute of Electrical and Electronic Engineers (IEEE) 1394 standard, or other suitable standards, which is not limited in this disclosure. As such, the connection interface 110 is configured to receive an external input such as a write command and a word line address associated with the write command.

The memory array 150 includes one or more memory banks, and each memory bank may include an ECC detector 151, a plurality of memory cells controlled by a word line address. The memory cells of a word line address may have a plurality of redundant memory cells controlled by a redundant word line address. The fuse blowing controller 170 is configured to receive the word line address to blow an electrical fuse of the word line address to enable the plurality of redundant memory cells. The memory control circuit 130 would coordinate among the connection interface 111, the memory array 150, and the fuse blowing controller 170 to execute functions of the memory storage device 100 such as the write operation.

After receiving a write command or a read command, the memory control circuit 130 may coordinate the hardware of the memory storage device to perform a write operation or a read operation to the plurality of memory cells. The ECC detector would then detect whether the write operation or the read operation has resulted in an error. Upon detecting an error, the ECC detector would send out a failure indication to indicate that an error from the write operation or the read operation has been detected. The failure indication is used to trigger the automatic error repair mechanism, and the failure indication could be an ECC failure flag. The ECC detector may send out an ECC failure flag after one or more ECC failures. The ECC failure flag could be latched and enable the memory control circuit and the fuse blowing controller to implement the automatic error repair mechanism.

Next, the memory control circuit may coordinate the fuse blowing controller 170 to blow the electrical fuse of the word line address to enable the plurality of redundant memory cells after receiving the failure indication. Subsequently, the memory control circuit 130 may coordinate the transfer of data from the plurality of memory cells through a bit line into the plurality of redundant memory cells after the electrical fuse has been blown. The blowing controller 170 may transmit a fuse blowing flag which indicates that blowing the electrical fuse of the word line address has been complete. The memory control circuit 130 may then wait for an auto-refresh command or a self-refresh command in response to receiving both the fusing blowing flag and the ECC failure flag. The memory control circuit 130 may refresh the plurality of redundant memory cells in response to receiving the auto-refresh command or the self-refresh command.

The transfer the data from the plurality of memory cells through the bit line into the plurality of redundant memory is accomplished without transferring the data through a data line. In this way, the memory storage device is able to operate independently from any normal function of the memory storage device without collisions with other operations since another write operation or another read operation may potentially use the same word line. After, an auto-refresh command or the self-refresh command has been detected, the memory control circuit 130 would transfer data from the plurality of memory cells through the word line into the plurality of redundant memory cells by copying the data directly from a sense amplifier into the plurality of redundant memory cells so as to bypass the use of data lines.

Figure 2:
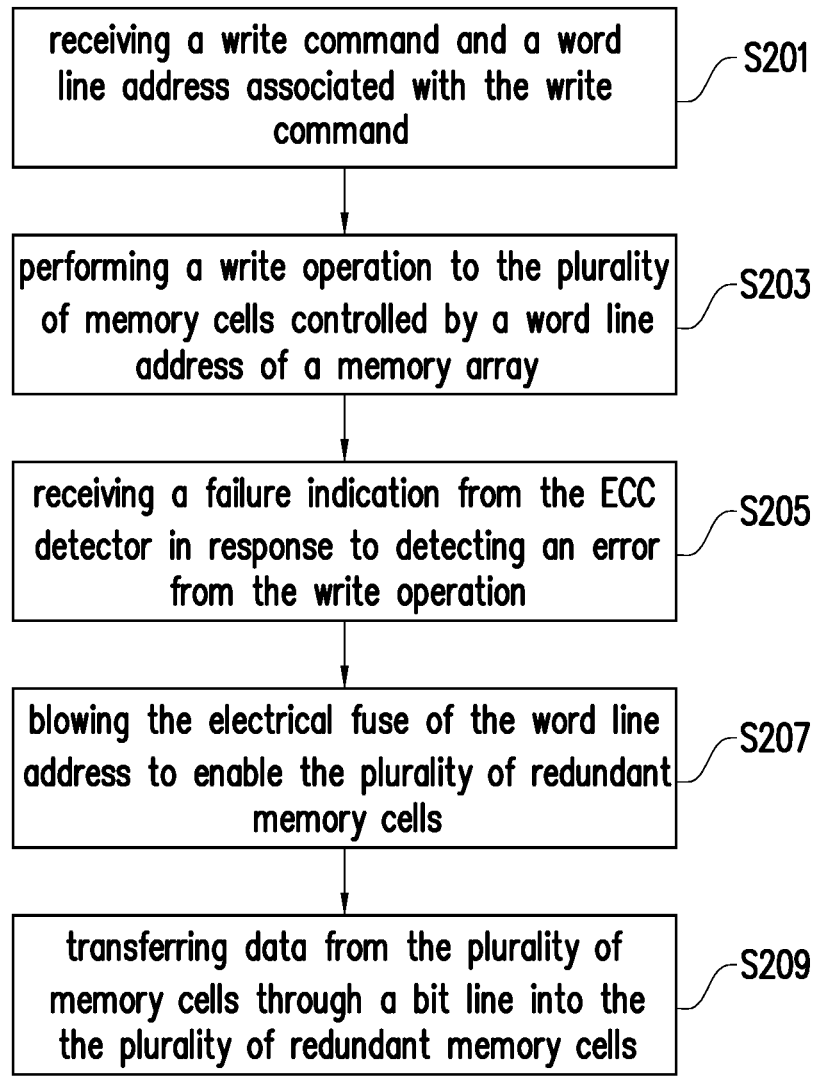
FIG. 2 is a flow chart which illustrates the automatic error repair method used by a memory storage device in accordance with one of the exemplary embodiments of the disclosure.

The disclosure also provides an automatic error repair method not limited to the steps shown by FIG. 2. Referring to FIG. 2, in step S201, the memory storage device would receive not limited to an active or a write command and a word line address associated with the write command. The active or the write command may include a row address, a column address, or a block address. The active command may include a row address or a block address. The write command or the read command may further include a column address. In step S203, the memory storage device would perform a write operation to the plurality of memory cells controlled by a word line address of a memory array. In step S205, the memory storage device would receive a failure indication from the ECC detector in response to detecting an error from the write operation. The ECC detector would perform an ECC operation which may happen during a read operation or a write operation according to the Joint Electron Tube Engineering Council (JEDEC) standard for example. Also, the row address could be inserted before a write operation, or a read operation may come with a row address. In step S207, the memory storage device would blow the electrical fuse of the word line address to enable the plurality of redundant memory cells. In step S209, the memory storage device would transfer data from the plurality of memory cells through a bit line into the plurality of redundant memory cells.

Figure 3:
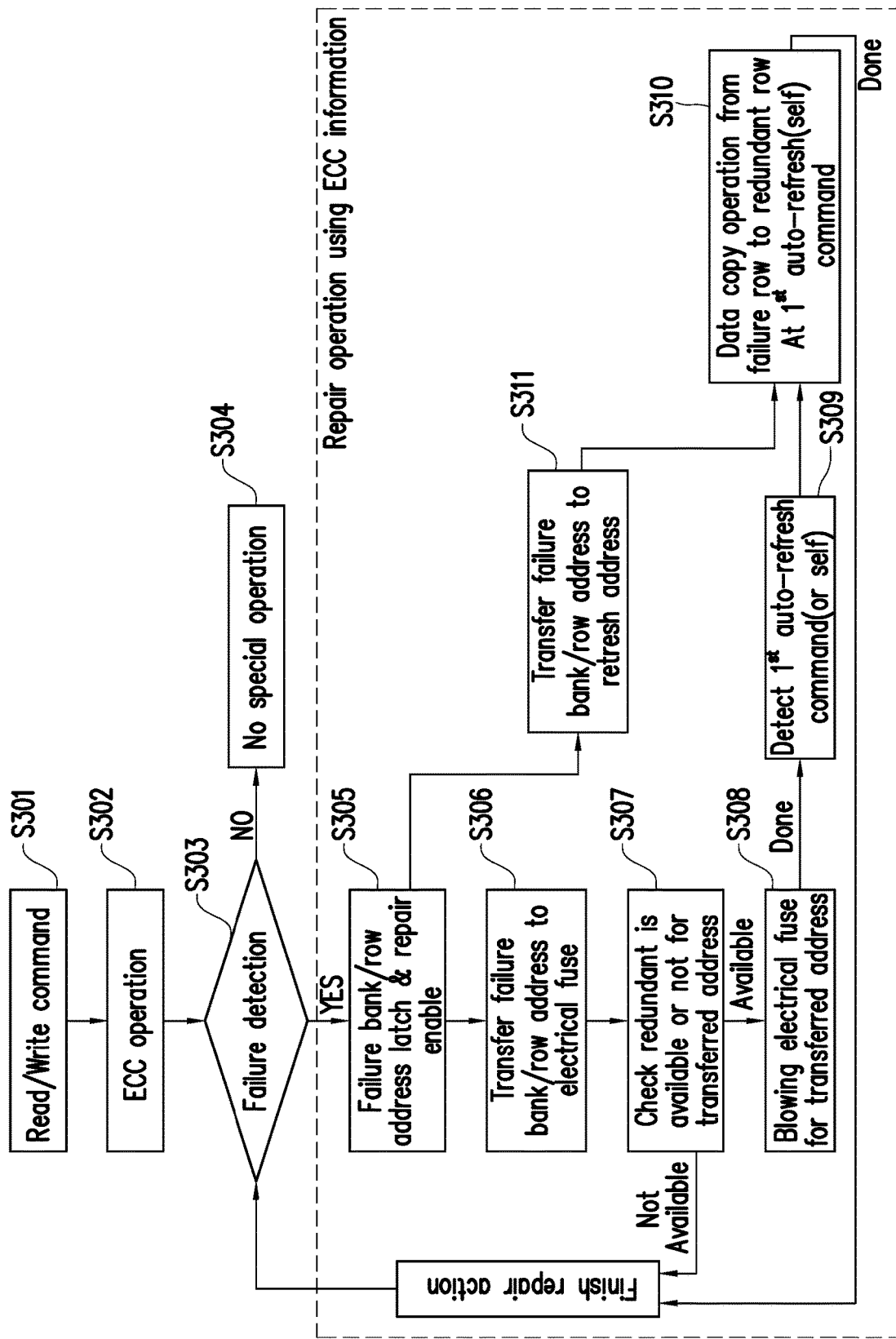
FIG. 3 is a flow chart which illustrates the automatic error repair method in further detail in accordance with one of the exemplary embodiments of the disclosure.

To further elucidate the inventive concept as described in FIG. 1 and FIG. 2 and their corresponding written descriptions, the disclosure provides several examples to describe the inventive concept in further details. Referring to FIG. 3, in a step S301, the memory storage device 100 would receive a read or write command to write user data into a location of the memory 150. The write command may include a row address, a column address, or a block address. For instance, according to an exemplary embodiment, the write command could be an 'active' command which include a row address so as to write to memory cells in a specific row to be followed by a 'write' command which includes a column address so as to write to memory cells in a specific column of the specific row.

In step S302, the user data could be encoded under a particular ECC scheme, and subsequently the ECC detector 151 may apply an algorithm of the particular ECC scheme to detect for errors. In step S303, assuming that the ECC detector 151 has detected an error after one or more detection attempt, the ECC detector may transmit a failure indication to the memory controller circuit 130. The failure indication could be an ECC failure flag. Alternatively, one or more write attempts with higher write voltage or longer write time could be attempted after the ECC detector 151 has detected an error. If no error has been detected, then in step S304, the memory storage device 100 would proceed with normal operations. However, once the ECC detector 151 has transmitted a failure indication to the memory control circuit 130, then the automatic error repair mechanism would be triggered.

In step S305, the memory array 150 would transmit a failure address from the ECC detector 151 assuming that the write operation has failed at the address of the row and of the memory bank where the user data was attempted to be stored. The failure address would be latched by a failure address latch. In step S306, the failure address latch would transmit the failure address to the fuse blowing controller, and in step S311, the failure address latch would also transmit the failure address to a refresh address latch. In step S307, the memory control circuit 130 may check whether there are any redundant memory cells available or not to replace the memory cells of the failure address. According to an exemplary embodiment, there could be a spare row of redundant memory cells to be used for each existing memory cells. Alternatively, there could be a spare memory bank containing a plurality of rows of redundant memory cells to potentially replace a damaged row of cells. The exact number of spare memory bank or spare row of redundant memory cells are flexible and can be adjusted based on design considerations.

Assuming that there are no redundant memory cells available for the failure address, the in step S312, the memory control circuit 130 would reset the repair function or may resort to an alternative solution to cope with the error. Assuming that there is no redundant memory cells available for the failure address, the in step S308, the fuse blowing controller 170 may reset all repair related actions and go back to normal operation. For example, if a block where failure occurs does not have any more repair units (e.g. redundant row, redundant block, etc.) available, there would not any repair actions so that the repair could be given up to allow the memory device to go back to its normal operations. However, if a next failure in another block has been detected by the ECC detector and a repair unit is available, then the subsequent repair action would ensue by copying from the memory cells of the failure address to the memory cells corresponding to the redundant word line address.

According to an exemplary embodiment, the failure address is a word line address of the row of memory cells which have been determined to contain one or more physical error, the memory cells of the word line address is to be replaced to redundant memory cells of another redundant word line address. However, after the replacement, the physical address of the redundant word line address would remain the same as the word line address which was replaced. After the fuse blowing controller 170 has finished blowing the fuse for the failure address, the fuse blowing controller 170 would transmit a fuse blowing flag which indicates that the fuse has been blown.

In response to receiving both the ECC failure flag and the fuse blowing flag, in step S309, the memory control circuit 130 would wait and detect a next auto-refresh or a self-refresh command, and the failure address could also be latched by a refresh address generator. In step S310, after the auto-refresh or self-refresh command has been received, the failure address would function as the refresh address as the redundant memory cells would undergo a refresh operation during which the user data previously stored in the memory cells of the failure address (i.e. word line address) would be copied to the redundant memory cells. According to an exemplary embodiment, assuming that the failure address is a row of memory cells controlled by a word line, the user data would be copied from the row of memory cells corresponding to the failure address into a new row of redundant memory cells controlled by another word line. In other words, during the auto-refresh command or the self-refresh command, data from the failed word line address is coped to the redundant word line address. After receiving the auto-refresh or self-refresh command, both the ECC failure flag and the fuse blowing flag would be disabled. The repair action would then be complete.

Based on the mechanism provided, the memory storage device 100 would be able to perform failure detection, and automatic error repair simultaneously and continuously, since the repair operation would not occupy the data lines. In this way, the memory storage device 100 would be able to operate normally without affecting the normal operation of the memory storage device 100.

Figure 4:
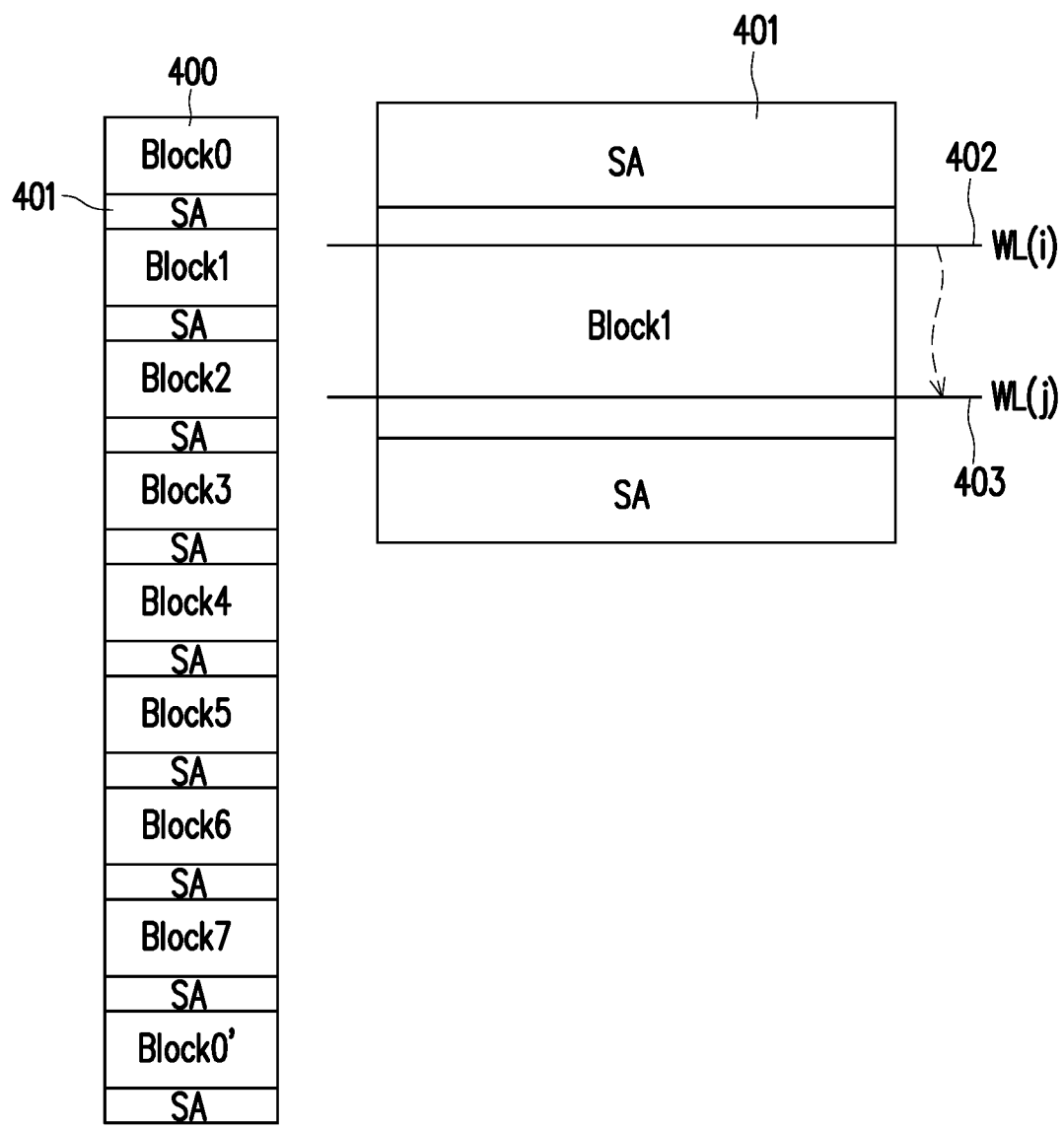
FIG. 4 shows an example of a failure repair by an electrical fuse technique in accordance with one of the exemplary embodiments of the disclosure.

The copying operation is provided with further details in FIG. 4 and its corresponding written descriptions. The memory array 150 may have at least but not limited to multiple memory blocks 400 with a sense amplifier (SA) connecting each memory block, and each memory block may contain one or more rows of memory cells. Assuming that an error has been determined by the ECC detector 151 to have occurred within memory cells controlled by a word line address WL(i) 402 in the memory block1 401, the user data stored in the memory cells corresponding to the word line address WL(i) 402 would be copied over to redundant memory cells corresponding to the word line address WL(j) 403. The copying operation is accomplished from cells controlled by one word line to redundant cells controlled by another word line through each of the respective bit lines without going through a data line.

According an exemplary embodiment, the copying operation could be accomplished during an auto-refresh or self-refresh operation. Typically, during an auto-refresh or self-refresh operation, user data stored in memory cells controlled by a word line could be stored in a sense amplifier first and then the user data could be copied from the sense amplifier back to the memory cells controlled by the word line in order to complete the auto-refresh or self-refresh operation. However, in this exemplary embodiment, stored in the memory cells corresponding to the word line address WL(i) 402 could be stored in the sense amplifier and then copied over to the redundant memory cells corresponding to the word line address WL(j) 403. In this way, user data could be copied from cells controlled by one word line to redundant cells controlled by another word line through each of the respective bit lines without going through a data line so that the error repair mechanism would not interfere with normal operations of the memory storage device 100.

Figure 5:
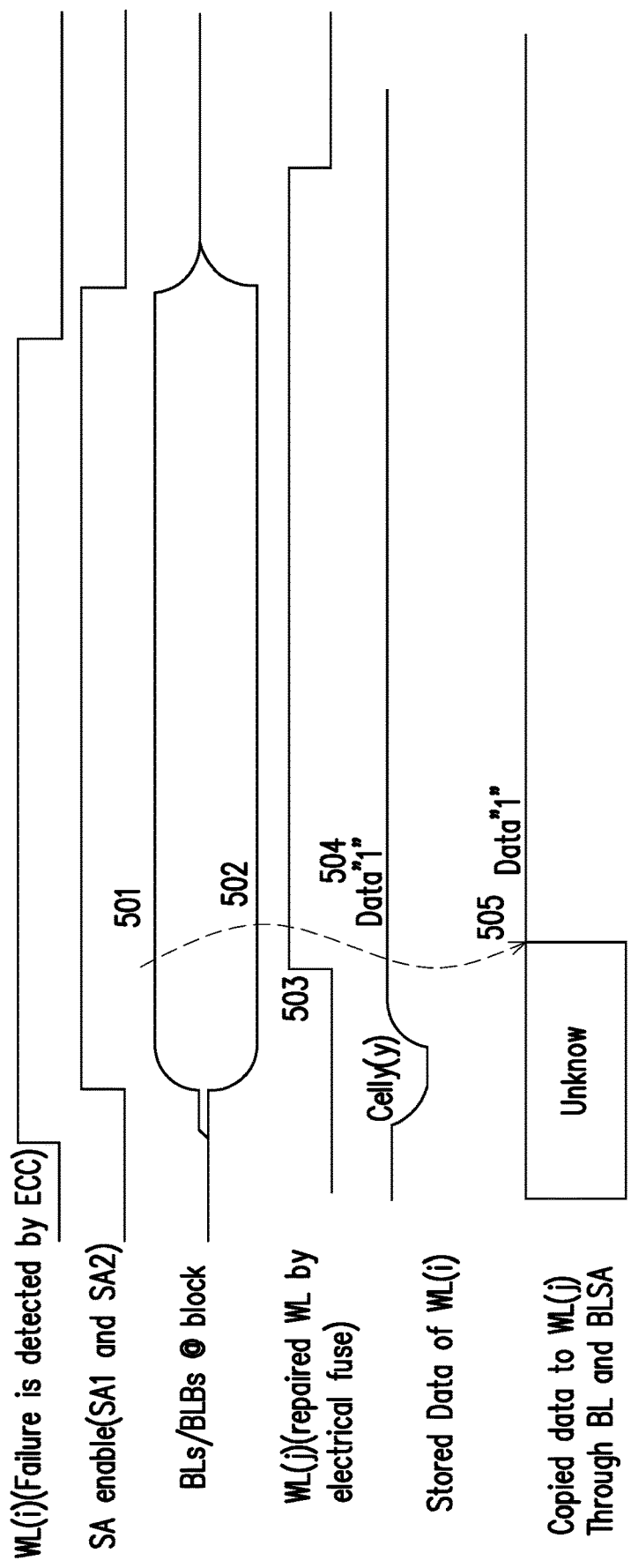
FIG. 5 is a timing diagram for a copying function to copy data "1" from a failed word line address to a redundant word line address in accordance with one of the exemplary embodiments of the disclosure.

As an example, FIG. 5 shows a timing diagram for a copying data "1" from a failed word line address to a redundant word line. As seen in FIG. 5, after a failure has been detected by the ECC detector 151, voltage of the word line, WL(i) corresponding to Cell (y), would be pulled high. Subsequently, the sense amplifiers, S1 and S2, which correspond to the word line, WL(i), and the redundant word line, WL(j), would be enabled as the voltages are pulled high. Since the bit line (BL) voltage 501 at S1 is greater than the bit line bar (BLB) voltage 502, the data to be copied is '1'. After the fuse blowing controller 170 has finishing blowing the fuse for the failed address, WL(j) is activated as the WL(j) voltage 503 is pulled high. Next, the original stored data 504 stored in a cell controlled by the WL(i) is copied through a bit line and the bit line sense amplifier to a redundant cell controlled by WL(j), which could be a memory cell corresponding to Cell(y), as a redundant stored data 505 which would also have the value of '1'. Essentially, after a failure has been detected during a read operation or a write operation. The data copying operation would be performed at the next auto-refresh or self-refresh operation after the failure has been detected and repaired.

Figure 6:
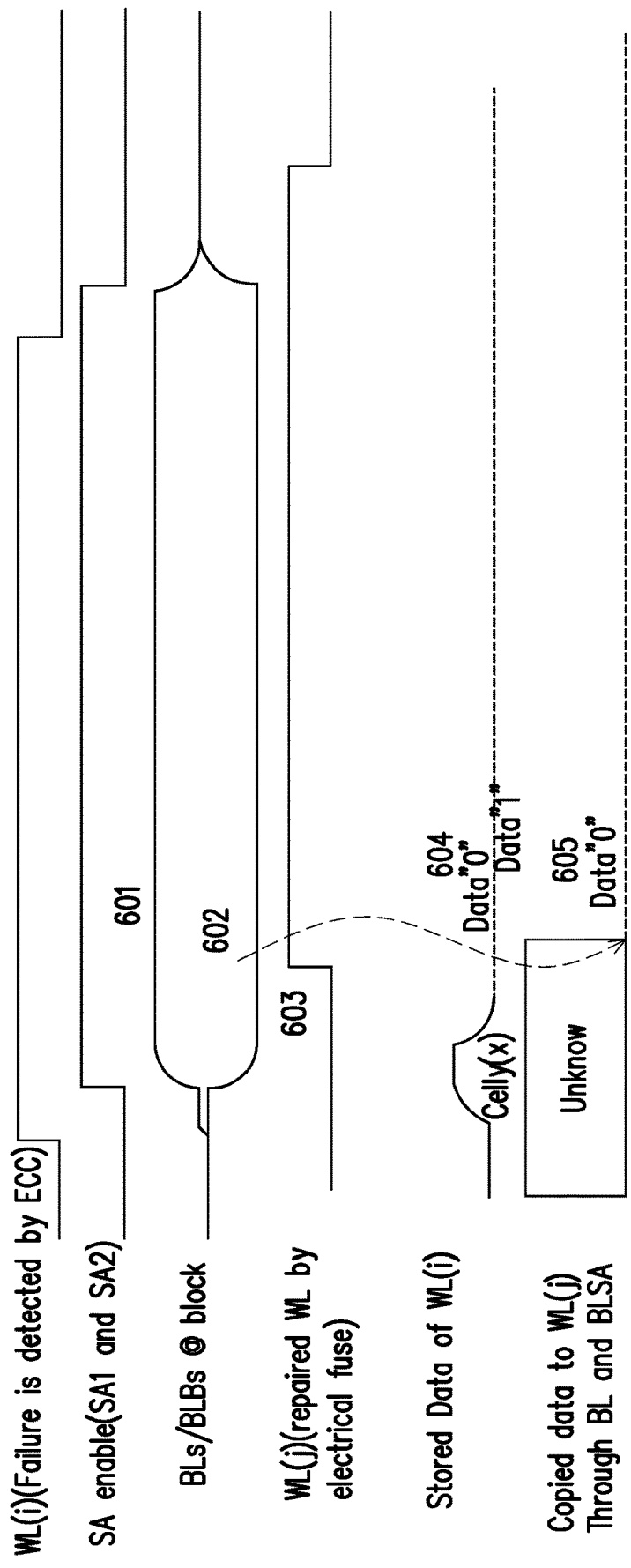
FIG. 6 is a timing diagram for a copying function to copy data "0" from a failed word line address to a redundant word line address in accordance with one of the exemplary embodiments of the disclosure.

FIG. 6 shows a similar example for a copying data "0" from a failed word line address to a redundant word line. As seen in FIG. 6, after a failure has been detected by the ECC detector 151, voltage of the word line, WL(i) corresponding to Cell(x), would be pulled high. Subsequently, the sense amplifiers, S1 and S2, which correspond to the word line, WL(i), and the redundant word line, WL(j), would be enabled as the voltages are pulled high. Since the bit line bar (BLB) voltage 601 at S1 is greater than the bit line (BL) voltage 602, the data to be copied is '0'. After the fuse blowing controller 170 has finishing blowing the fuse for the failed address, WL(j) is activated as the WL(j) voltage 603 is pulled high. Next, the original stored data 604 stored in a cell controlled by the WL(i) is copied through a bit line and the bit line sense amplifier to a redundant cell, which could be a memory cell corresponding to Cell(x), controlled by WL(j) as a redundant stored data 605 which would also have the value of '0'. As stated above, after a failure has been detected during a read operation or a write operation. The data copying operation would be performed at the next auto-refresh or self-refresh operation after the failure has been detected and repaired.

Figure 7:
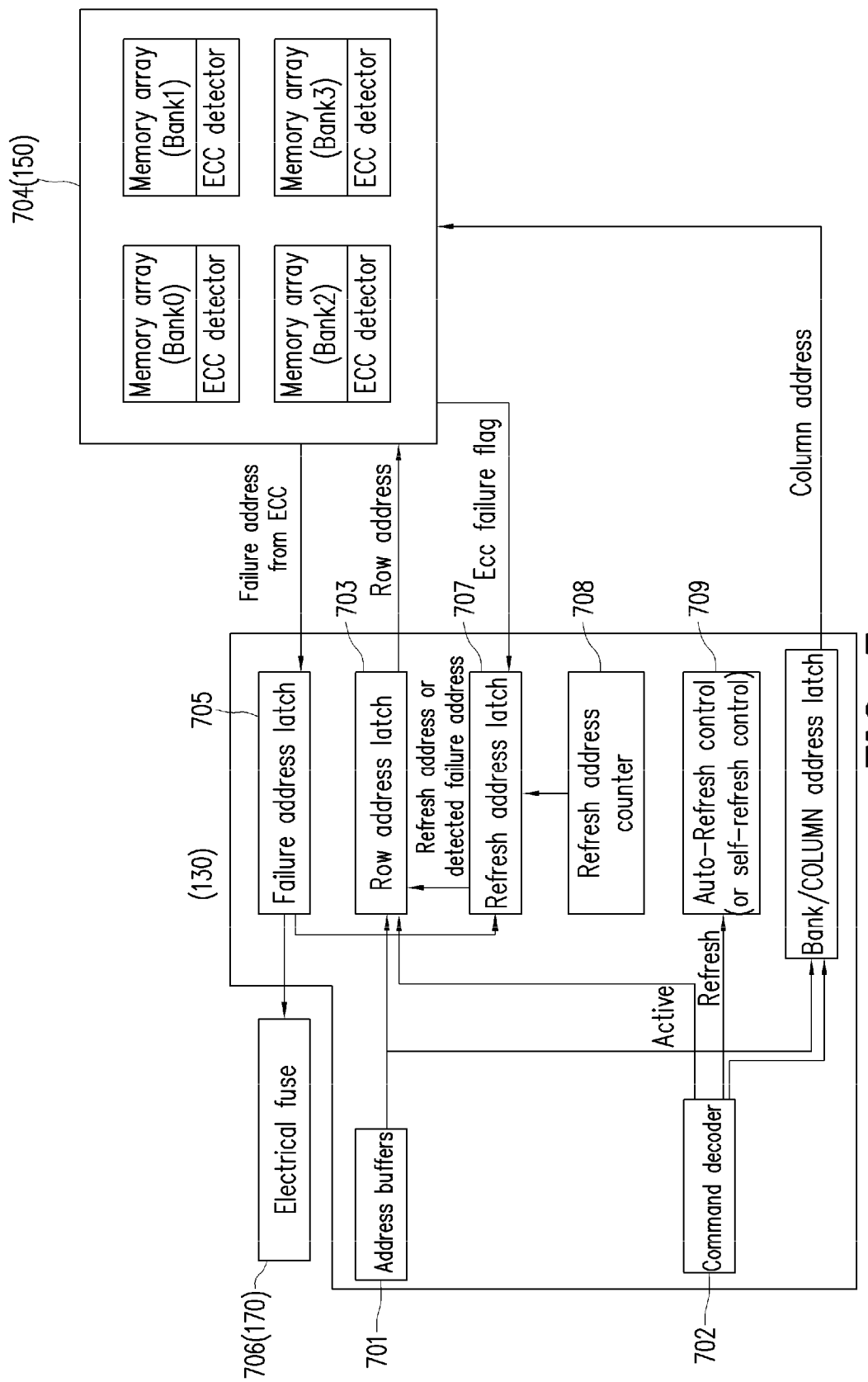
FIG. 7 shows a hardware diagram of the memory storage device having an automatic error repair mechanism in further detail in accordance with one of the exemplary embodiments of the disclosure.

FIG. 7 shows the automatic error repair mechanism in further detail from the perspective of a hardware diagram. Referring to FIG. 7, the command decoder 702 would receive an 'active' command which is a write command for a row address, and the address buffers 701 would receive a row address for writing user data into a row of one of the memory banks of a memory array 704 which is an example of the previously described memory array 150. The row address latch 703 would then receive the write command for the row address from the command decoder 702 as well as the row address from the address buffers 701. Next, the row address would be sent to memory array 704 so as to write the user data into the row address.

Assuming that one of the ECC detectors of the memory array 704 has detected an error for the user data stored in one or more cells corresponding the row address, then after one or more detection attempt, the ECC detector may transmit an ECC failure flag to a refresh address latch 707 of the memory controller circuit 130 which includes elements 701 702 703 705, 707, 708, and 709. Alternatively, one or more write attempts with higher write voltage or longer write time could be attempted to fix the error. If the error cannot be fixed, it could mean that the error is of a physical nature and thus cannot be repaired. As one the ECC detectors transmits the ECC failure flag to trigger automatic error repair mechanism, the ECC detector would also transmit a failure address to a failure address latch 705. In response to receiving the failure address, the failure address latch 705 would transmit the failure address to the refresh address latch 707 and also to a fusing blowing controller 706 (i.e. 170) to blow the electric fuse corresponding to the failed address. After the fuse blowing controller 170 has finished blowing the fuse for the failure address, the fuse blowing controller 170 would transmit a fuse blowing flag which indicates that the fuse has been blown.

In response to receiving both the ECC failure flag and the fuse blowing flag, the refresh address latch 707 would wait and detect a next auto-refresh or a self-refresh command which may occur at a regular interval as determined by the refresh address counter 708 or may occur after receive a refresh command from the command decoder 702 to an auto-refresh or self-refresh control circuit 709. After the auto-refresh or self-refresh command from the refresh address counter 708 has been received by the refresh address latch 707, the redundant memory cells would undergo a refresh operation during which the user data previously stored in the memory cells of the failure address (i.e. word line address) would be copied to the redundant memory cells. Since it is assumed that the failure address is a row of memory cells controlled by a word line, the user data would be copied from the row of memory cells controlled by the word line into a row of redundant memory cells controlled by a redundant word line. After receiving the auto-refresh or self-refresh command, both the ECC failure flag and the fuse blowing flag would be disabled.

Figure 8:
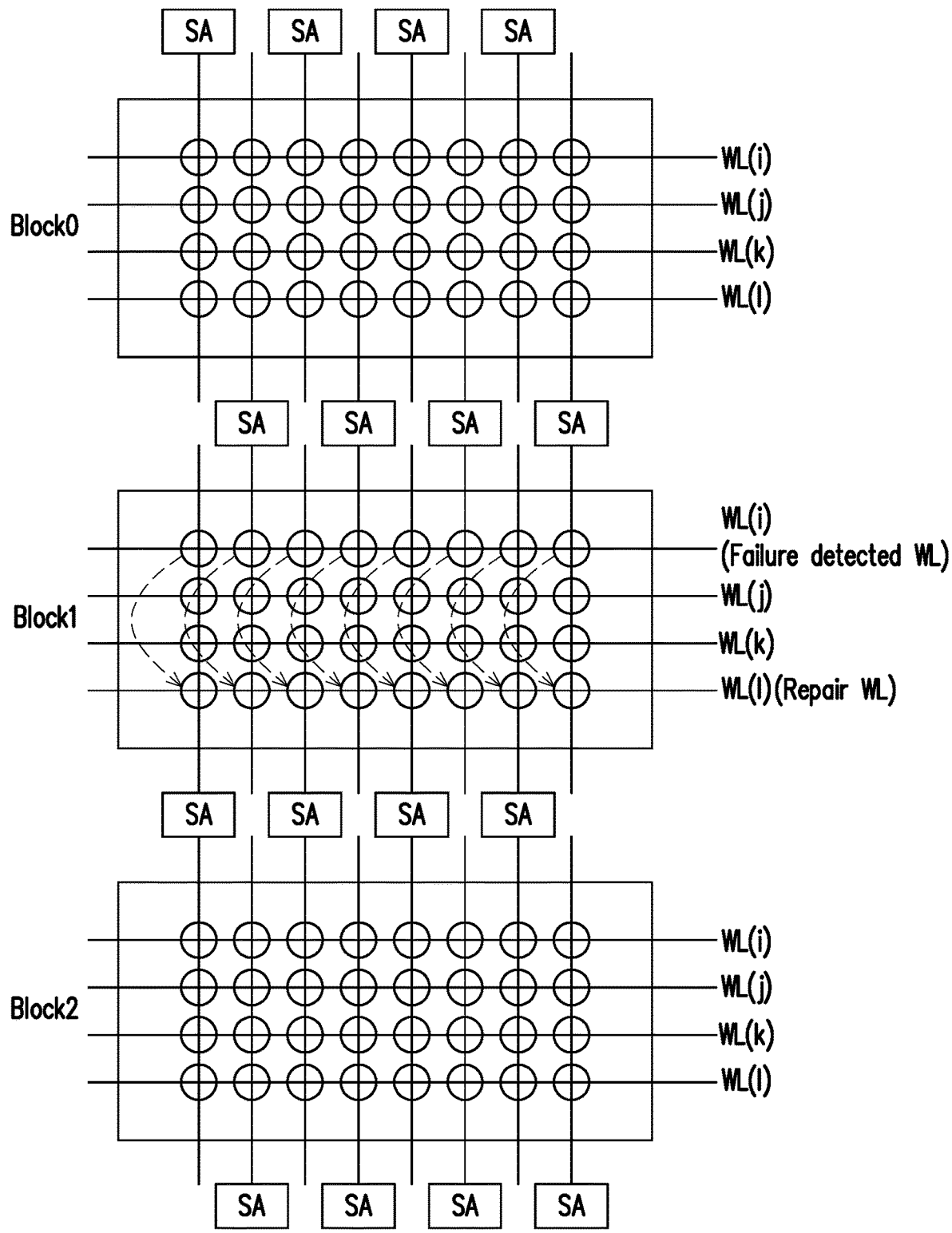
FIG. 8 shows an example of transferring data from memory cells controlled by a word line which has been detected as having been failed through each of the perspective bit lines into redundant memory cells controlled by a redundant word line in accordance with one of the exemplary embodiments of the disclosure.

FIG. 8 shows a data copying operation during a bulk data movement (backup) operation for copying data from Block 1 to a redundant memory location (e.g. Backup 01/12). As shown in FIG. 8, Block 1 includes a plurality of memory cells controlled by at least three rows of word lines, $W_L(i)$, $W_L(j)$, $W_L(k)$, and a redundant word line $W_L(l)$. The data of each column of the plurality memory cells could be output through a bit line connected to a sense amplifier. Assuming that the ECC detector has detected defective memory cells controlled by $W_L(i)$ which is the failure detected WL during a read or a write operation, the fuse controller would activate the row of memory cells controlled by the redundant word line WL($_j$) which is the repair WL. Data from the memory cells controlled by $W_L(i)$ is copied to memory cells controlled by $W_L(l)$. The data copying operation would be performed at the next auto-refresh or self-refresh operation after the failure has been detected and repaired.

It is worth noting that even though the automatic error repair mechanism provided repairs in a per-row basis is used as examples, this disclosure is not limited to repairing in a per-row basis as the automatic error repair mechanism may also be used to repair in a per-column basis or in a per-block basis.

In view of the aforementioned descriptions, the disclosure is suitable for being implemented by a memory storage device such as a dynamic random access memory (DRAM) and is able to automatically repair errors without receiving any external command from a user and operate independently from any normal function of the memory storage device so that the automatic error repair mechanism would not induce additional operating time and would not cause memory performance degradation.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A memory storage device comprising:
   a connection interface configured to receive a write or read command and a word line address associated with the write or read command;
   a memory array comprising a memory bank which comprises an error correction code (ECC) detector, a plurality of memory cells controlled by the word line address, and a plurality of redundant memory cells controlled by a redundant word line address;
   a fuse blowing controller configured to receive the word line address to blow an electrical fuse of the word line address to enable the plurality of redundant memory cells; and
   a memory control circuit coupled to the connection interface, the memory array and the fuse blowing controller and configured to:
   perform a write or read operation to the plurality of memory cells in response to receiving the write or read command;
   receive a failure indication from the ECC detector in response to detecting an error from the write or read operation;
   blow the electrical fuse of the word line address to enable the plurality of redundant memory cells in response to receiving the failure indication; and
   automatically transfer data from the plurality of memory cells through a bit line into the plurality of redundant memory cells in response to the electrical fuse having been blown.

2. The memory storage device of claim 1, wherein transfer the data from the plurality of memory cells through the bit line into the plurality of redundant memory cells comprising:
   detect an auto-refresh command; and
   transfer data from the plurality of memory cells through the bit line into the plurality of redundant memory cells by copying the data from a sense amplifier into the plurality of redundant memory cells.

3. The memory storage device of claim 2, wherein transfer the data from the plurality of memory cells through the bit line into the plurality of redundant memory cells further comprising:
   transfer the data from the plurality of memory cells through the bit line into the plurality of redundant memory cells without transferring the data through a data line.

4. The memory storage device of claim 1, wherein the ECC detector is configured to:
   perform an ECC check;
   repair data associated with the word line address in response to failing the ECC check; and
   transmit the failure indication to the memory control circuit in response to failing to repair the data.

5. The memory storage device of claim 4, wherein transmit the failure indication to the memory control circuit in response to failing to repair the data comprising:
   transmit to the memory control circuit the word line address and an ECC failure flag in response to failing to repair the data.

6. The memory storage device of claim 5, wherein the fuse blowing controller is further configure to:
   transmit a fuse blowing flag which indicates that blowing the electrical fuse of the word line address has been complete.

7. The memory storage device of claim 6, wherein the memory control circuit is further configured to:
   wait for an auto-refresh command or a self-refresh command in response to receiving the fusing blowing flag and the ECC failure flag.

8. The memory storage device of claim 7, wherein the memory control circuit is further configured to:
   refresh the plurality of redundant memory cells in response to receiving the auto-refresh command or the self-refresh command.

9. The memory storage device of claim 5, wherein the memory control circuit further comprising:

a refresh address latch configured to receive the ECC failure flag and the word line address for performing a refresh operation of the plurality of redundant memory cells.

10. The memory storage device of claim 1, wherein the plurality of redundant memory cells and the plurality of memory cells have the same row address.

11. An automatic error repair method used by a memory storage device, the method comprising:
   receiving a write or read command and a word line address associated with the write or read command;
   performing a write or read operation to a plurality of memory cells controlled by the word line address of a memory array in response to receiving the write or read command, wherein the memory array comprising a memory bank which comprises an error correction code (ECC) detector, the plurality of memory cells, and a plurality of redundant memory cells controlled by a redundant word line address;
   receiving a failure indication from the ECC detector in response to detecting an error from the write or read operation;
   blowing an electrical fuse of the word line address to enable the plurality of redundant memory cells in response to receiving the failure indication; and
   automatically transferring data from the plurality of memory cells through a bit line into the plurality of redundant memory cells in response to the electrical fuse having been blown.

12. The method of claim 11, wherein transferring the data from the plurality of memory cells through the bit line into the plurality of redundant memory cells comprising:
   detecting an auto-refresh command; and
   transferring data from the plurality of memory cells through the bit line into the plurality of redundant memory cells by copying the data from a sense amplifier into the plurality of redundant memory cells.

13. The method of claim 12, wherein transferring the data from the plurality of memory cells through the bit line into the plurality of redundant memory cells further comprising:
   transferring the data from the plurality of memory cells through the bit line into the plurality of redundant memory cells without transferring the data through a data line.

14. The method of claim 11, wherein receiving the failure indication from the ECC detector further comprising:
   performing an ECC check;
   repairing the data associated with the word line address in response to failing the ECC check; and
   receiving the failure indication from the ECC detector in response to failing to repair the data.

15. The method of claim 14, wherein receiving the failure indication from the ECC detector in response to failing to repair the data comprising:
   receiving the word line address and an ECC failure flag in response to failing to repair the data.

16. The method of claim 15 further comprising:
   receiving a fuse blowing flag which indicates that blowing the electrical fuse of the word line address has been complete.

17. The method of claim 16 further comprising:
   waiting for an auto-refresh command or a self-refresh command in response to receiving the fusing blowing flag and the ECC failure flag.

18. The method of claim 17 further comprising:
   refreshing the plurality of redundant memory cells in response to receiving the auto-refresh command or the self-refresh command.

19. The method of claim 15 further comprising:
   receiving the ECC failure flag and the word line address for performing a copy operation during a refresh period of the plurality of redundant memory cells.

20. The method of claim 11, wherein the plurality of redundant memory cells and the plurality of memory cells have the same row address.

* * * * *